(12) United States Patent
Wang et al.

(10) Patent No.: US 7,372,158 B2
(45) Date of Patent: May 13, 2008

(54) HDP-BASED ILD CAPPING LAYER

(75) Inventors: Yun-Yu Wang, Poughquag, NY (US); Richard A Conti, Katonah, NY (US); Chung-Ping Eng, Hopewell Junction, NY (US); Matthew C Nicholls, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 11/467,593

(22) Filed: Aug. 28, 2006

(65) Prior Publication Data

US 2007/0004206 A1   Jan. 4, 2007

Related U.S. Application Data

(63) Continuation of application No. 10/904,827, filed on Dec. 1, 2004, now Pat. No. 7,138,717.

(51) Int. Cl.
*H01L 29/40* (2006.01)
(52) U.S. Cl. ................................ 257/760; 257/758
(58) Field of Classification Search ............... 257/760, 257/758
See application file for complete search history.

(56) References Cited

U.S. PATENT DOCUMENTS

| | | | |
|---|---|---|---|
| 6,043,152 A | 3/2000 | Chang | |
| 6,080,529 A | 6/2000 | Ye | |
| 6,099,701 A | 8/2000 | Liu | |
| 6,107,188 A | 8/2000 | Liu | |
| 6,127,238 A | 10/2000 | Liao | |
| 6,153,523 A | 11/2000 | Van Ngo | |
| 6,162,583 A | 12/2000 | Yang | |
| 6,211,061 B1 | 4/2001 | Chen | |

(Continued)

FOREIGN PATENT DOCUMENTS

JP   1111843   4/1989

(Continued)

OTHER PUBLICATIONS

Soo Geun Lee, et al., "Low Dielectric Constant 3MS a SiC:H as Cu Diffusion Barrier Layer in Cu Dual Damascene Process", Japanese Journal of Applied Physics, Part 1, Vo. 40, No. 4B, pp. 2663-2668, Apr. 2001.

(Continued)

*Primary Examiner*—Roy Potter
(74) *Attorney, Agent, or Firm*—Howard M. Cohn (57) ABSTRACT

A cap nitride stack which prevents etch penetration to the HDP nitride while maintaining the electromigration benefits of HDP nitride atop Cu. In one embodiment, the stack comprises a first layer of HDP nitride and a second layer of a Si—C—H compound disposed over the first layer. The Si—C—H compound is for example BLoK, or N-BLoK (Si—C—H—N), and is selected from a group of materials that has high selectivity during via RIE such that RIE chemistry from the next wiring level does not punch through. Carbon and nitrogen are the key elements. In another embodiment, the stack comprises a first layer of HDP nitride, followed by a second layer of UVN (a plasma nitride), and a third layer comprising HDP nitride disposed over the second layer.

15 Claims, 3 Drawing Sheets

U.S. PATENT DOCUMENTS

| | | |
|---|---|---|
| 6,218,732 B1 | 4/2001 | Russell |
| 6,225,210 B1 | 5/2001 | Ngo |
| 6,235,633 B1 | 5/2001 | Jang |
| 6,261,951 B1 | 7/2001 | Buchwalter |
| 6,265,779 B1 | 7/2001 | Grill |
| 6,365,506 B1 | 4/2002 | Chang |
| 6,376,353 B1 | 4/2002 | Zhou |
| 6,441,491 B1 | 8/2002 | Grill |
| 6,737,747 B2 | 5/2004 | Barth |
| 2001/0000155 A1 | 4/2001 | Huang |
| 2001/0002333 A1 | 5/2001 | Huang |
| 2001/0002731 A1 | 6/2001 | Ueda |
| 2001/0003064 A1 | 6/2001 | Ohto |

FOREIGN PATENT DOCUMENTS

| | | |
|---|---|---|
| JP | 2001015480 | 1/2001 |
| JP | 2001053076 | 2/2001 |
| WO | WO9933102 | 7/1999 |
| WO | WO0019523 | 6/2000 |

OTHER PUBLICATIONS

R.D. Goldblatt, et al., "A High Performance 0.13 um Copper BEOL Technology with Low-k Dielectric", Proceedings of the IEEE 2000 International Interconnect Technology Conference, pp. 261-263, Jun. 5-7, 2000.

J. Yota, et al., "Comparison Between HDP CVD and PECVD Silicon Nitride for Advanced Interconnect Applications", Proceedings of the IEEE 2000 International Interconnect Technology Conference, pp. 76-78, Jun. 5-7, 2000.

HDP-BASED ILD CAPPING LAYER

RELATED APPLICATIONS

This application is a continuation application of pending U.S. patent application Ser. No. 10/904,827 having a filing date of Dec. 1, 2004 and a common assignee with the present invention.

BACKGROUND OF THE INVENTION

The invention relates to semiconductor device fabrication and, more particularly, to techniques for capping interlevel dielectric (ILD) layers of interconnect structures such as damascene interconnect structures.

An integrated circuit (IC) device (also referred to as a semiconductor chip) can contain millions of transistors and other circuit elements that are fabricated on a single silicon crystal substrate (wafer). For the IC device to be functional, a complex network of signal paths will normally be routed to connect the circuit elements distributed on the surface of the device. Efficient routing of these signals across the device can become more difficult as the complexity and number of circuit elements are increased. Thus, the formation of multi-level or multi-layered interconnection schemes such as, for example, dual damascene wiring (interconnect) structures, have become more desirable due to their efficacy in providing high speed signal routing patterns between large numbers of transistors and other circuit elements on a complex IC.

Damascene Techniques

Generally, damascene techniques involve depositing an interlevel dielectric (ILD) layer, such as silicon dioxide ($SiO_2$ also referred to simply as "oxide"), forming an opening in the ILD, overfilling the opening with a metal such as copper (Cu), and removing excess metal using chemical mechanical polishing (CMP), resulting in a planarized interconnect structure. This results in a single "wiring level" (or "interconnect level") of an overall "interconnect structure" having many wiring levels. The opening in the interconnect level may be a trench running essentially parallel to the surface of the integrated circuit (IC) chip, and a filled trench is referred to as a "wire" or a "line". A wire is used to route signals from a first location on the wafer to a second location remote from the first location. The trench for forming the wire may extend only partially (e.g., halfway) into the thickness of the ILD, from the top surface thereof. In a sense, the copper conductor is "embedded" in the ILD.

Alternatively, an opening in the interconnect level may be a via, extending perpendicular to the surface of IC completely through the ILD for connecting an overlying wire of a higher wiring level or of the present wiring level (in dual damascene, described below) to an underlying wire of a lower wiring level. A filled via is typically simply referred to as a "via", and sometimes as a "plug" particularly when connecting to an underlying first metallization (Ml) or to an element of an underlying MOS (metal oxide semiconductor) structure. Vias and wires are both referred to herein as "conductors", since their raison d'etre is conducting electrical signals.

In "dual" damascene techniques, the opening in the ILD comprises a lower contact or via hole portion in communication with an upper trench portion, and both the via and the trench portions are simultaneously filled.

Presently, interconnect structures formed on an integrated circuit chip consist of at least about 2 to 8 wiring levels fabricated at a minimum lithographic feature size (currently approximately 0.25 µm (microns) designated about 1× (referred to as "thinwires") and above these levels are about 2 to 4 wiring levels fabricated at a width equal to about 2× and/or about 4× the minimum width of the thinwires (referred to as "fatwires"). A typical width for a via is about 130 nm (nanometers), and it is common to have redundant vias effecting connections between overlying and underlying wires. 1 µm (micron)=1000 nm (nanometers).

Copper (Cu) and Cu alloys have received considerable attention as a candidate for replacing aluminum (Al) and Al alloys in interconnect metallizations. Cu is relatively inexpensive, easy to process, and has a lower resistivity than Al. In addition, Cu has improved electrical properties vis-a-vis tungsten (W), making Cu a desirable metal for use as a conductive plug as well as conductive wiring. As use herein, "Cu" is intended to encompass high purity elemental copper as well as Cu-based alloys, such as Cu alloys containing minor amounts of tin, zinc, maganese, titanium, magnesium, germanium, aluminum and silicon.

Due to Cu diffusion through interdielectric layer (ILD) materials, such as silicon dioxide, Cu interconnect structures should be encapsulated by a diffusion barrier layer (or "liner"). Conventional practices comprise forming a damascene opening in an ILD, and depositing a barrier layer such as TaN, lining the sidewalls and bottom of the opening in the ILD prior to depositing the Cu for the via or wire.

Typical diffusion barrier layer metals include tantalum (Ta), tantalum nitride (TaN), titanium nitride (TiN), titanium-tungsten (TiW), tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The advantage of using such barrier layer materials to encapsulate Cu is not limited to the interface between Cu and the dielectric interlayer, but includes interfaces between the Cu and other metals as well.

The upper surface of any Cu conductor (typically a wire, since a via, by definition, will always be in contact with a bottom surface of an overlying conductor) must also be protected, such as against oxidation. To cap the upper surface of the copper interconnection, a "capping layer" of a dielectric material such as silicon nitride ($Si_3N_4$, also simply referred to as "nitride") is typically employed. The capping layer is also referred to as a "passivation layer". Often the passivation layer must also function as an etch stop layer during subsequent processing, however materials which perform best as etch stop layers often do not perform best as passivation layers. For example, silicon oxynitride, SiON, is useful as an etch stop layer but it is less desirable as a passivation layer because of delamination which can occur between copper and silicon oxynitride. Silicon nitride, "SiN", avoids the delamination problem, and is a preferred passivation material, but is less desirable as an etch stop layer.

Figure 1:
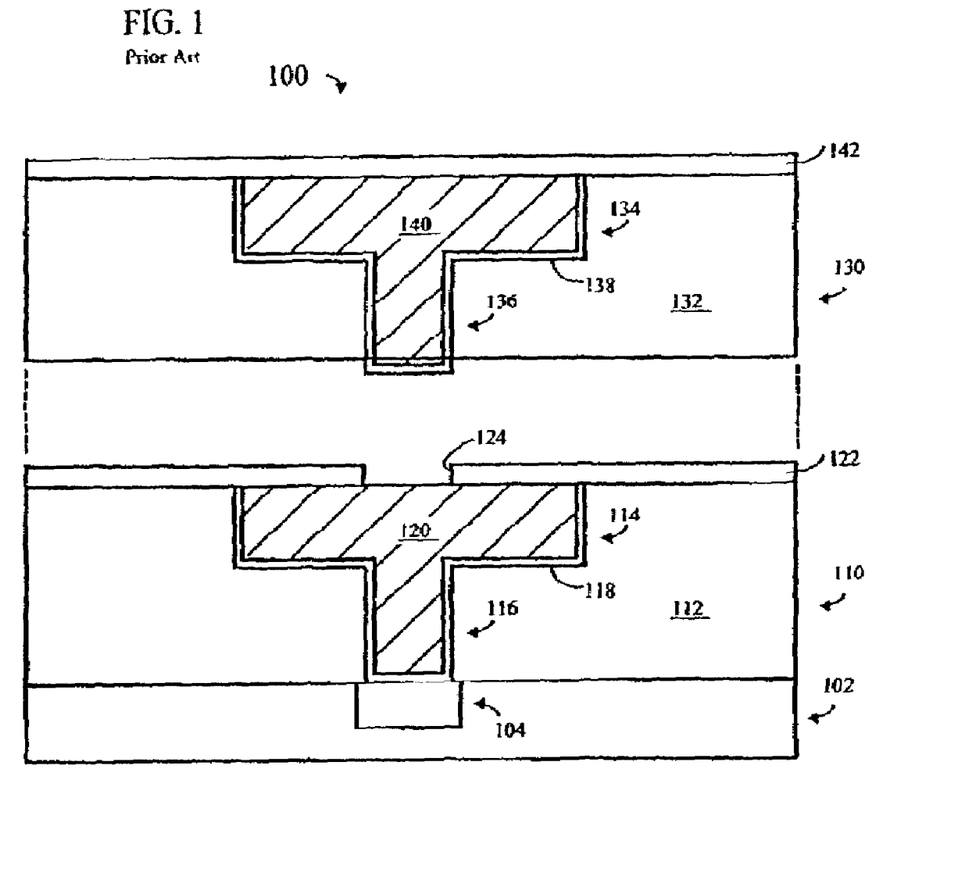
FIG. 1 is an exploded cross-sectional view of an interconnect structure having multiple wiring levels, according to the prior art.

FIG. 1 illustrates a conventional BEOL (back end of line) interconnect structure 100 utilizing copper metallization, the barrier layers and the protective cap layers described above. The illustrated interconnect structure 100 comprises a first interconnect level 110 and a second interconnect level 130 and is shown (by way of example) as being formed on a substrate 102 such as a semiconductor wafer comprising a plurality of logic circuit elements such as transistors. A single "generic" contact area 104 is illustrated in the substrate 102 and is, for example, an electrode formed on a source or drain region of a MOSFET (metal oxide semiconductor, field effect transistor).

It should clearly be understood that FIG. 1 illustrates but an extremely small (microscopic) portion of an integrated circuit (IC) device, let alone a semiconductor wafer comprising a large plurality of such devices. For example, what is shown may have a width of only a few microns (μm) of a semiconductor wafer having a diameter of several inches. Also, in "real life" things are not so neat and clean, rectilinear and uniform as shown. However, for one of ordinary skill in the art to which the invention most nearly pertains, this and other figures presented in this patent application will be very useful, when taken in context of the associated descriptive text, for understanding the invention.

The first interconnect level 110 comprises an interlevel dielectric layer (ILD) 112, such as oxide which is prepared by a chemical vapor deposition (CVD) process and having an exemplary thickness of 8000 to 10,000 angstroms, or 800-1000 nm (nanometer). (1 nm=10 angstroms)

In a "via first" damascene process, a via 116 is formed, such as by reactive ion etching (RIE) and extends to the bottom surface of the ILD 112 (in this case, to the electrode 104 on the substrate 102). Then, a trench 114 is formed (also using RIE) extending into the ILD 112 from the top (as viewed) surface thereof, and having a depth of nominally several (e.g., 4-5) thousand angstroms.

The trench 114 and via 116 comprise the "opening" in the ILD 112. A barrier layer 118, such as TaN, is deposited such as by sputtering or CVD so that it lines the sidewalls and bottom of the opening in the ILD 112. A typical thickness for the barrier layer 118 is between 600 and 1,000 angstroms, and metal for the barrier layer will also deposit on the top surface of the ILD 112.

Copper (Cu) 120 is then deposited into the lined opening, and will overfill the opening. Next, chemical mechanical polishing (CMP) is performed to remove excess barrier material and copper from the surface of the ILD 112, leaving a planarized surface for subsequent semiconductor fabrication processes to be performed. The copper 120 forms a wire (or line) in the trench 114 and a plug (or via) in the via 116. Because the top surface of the wire is exposed, a capping layer 122 such as nitride is deposited by CVD on the surface of the wire, and has an exemplary thickness of 500 angstroms (50 nm). This capping layer 122 is eventually patterned, after the next level of dielectric (132) is deposited, using photoresist (not shown) and conventional photolithographic techniques, to have an opening 124 for allowing a via (136) of a subsequent (higher) wiring level (130) to make contact with the wire 120 in the trench 114.

The second interconnect level 130 is formed atop the first interconnect level 110 and is essentially identical to the first interconnect level 110. Both levels 110 and 130 are shown as being formed by a dual damascene process. The second interconnect level 130 comprises an interlevel dielectric layer (ILD) 112, such as oxide. A via 136 (compare 116) is formed, using RIE, extending to the bottom surface of the ILD 132. A trench 134 (compare 114) is formed in the ILD 132. The trench 134 and via 136 comprise the "opening" in the ILD 132.

After the via 136 is formed, the capping layer 122 is opened up 124 so that so that metal 140 filling the via 136 of the second interconnect level 130 can make electrical contact with the metal 120 filling the trench 114 of the underlying, first interconnect level 110.

A barrier layer 138, such as TaN, is deposited so that it lines the sidewalls and bottom of the opening in the ILD 132, and is processed as described hereinabove. Copper (Cu) 140 is deposited into the lined opening, and is processed as described hereinabove. The copper 140 forms a wire (or line) in the trench 134 and a plug (or via) in the via 136. A capping layer 142 such as nitride is deposited on the surface of the ILD 132 and the wire 140. If necessary, the capping layer 142 is will be opened up (compare 124) to allow a via (not shown) of a subsequent (higher) wiring level (not shown) to make contact with the wire 140 in the trench 134.

The dual damascene interconnect structure 100 shown in FIG. 1 is fabricated utilizing conventional damascene processing steps well known to those skilled in the art. Since such techniques are well known and are not critical for understanding the present invention, a detailed discussion of the same is not given herein. It will be understood that various steps and materials have been omitted, for illustrative clarity, such as seed layers, adhesion layers, cleaning steps and the like.

Dielectric layers 112 and 132 may be the same or different insulative inorganic or organic material. Suitable dielectrics include, but are not limited to: $SiO_2$ carbon rich oxides, fluorinated $SiO_2$ polyimides, diamond, diamond-like carbon, silicon polymers, paralyene polymers, fluorinated diamond-like carbon and other like dielectric compounds.

Low-k Dielectric Materials

Semiconductor devices are typically joined together to form useful circuits using interconnect structures comprising conductive materials (e.g., metal lines) such as copper (Cu) or aluminum (Al) and dielectric materials such as silicon dioxide ($SiO_2$). The speed of these interconnect structures can be roughly assumed to be inversely proportional to the product of the line resistance (R), and the capacitance (C) between lines. Line resistance can be reduced (hence, speed increased) by using copper (Cu) instead of aluminum (Al). To further reduce the delay and increase the speed, it is desirable to reduce the capacitance (C). One way in which this can be done is by reducing the dielectric constant "k", of the dielectric material in the interlevel dielectric layers (ILDs). Thus, there is considerable interest in developing "low-k" materials as well as deposition methods for them that are compatible with integrated circuit technology.

A common dielectric material for use in an interlevel dielectric layer (ILD) is silicon dioxide ($SiO_2$, also referred to simply as "oxide"). Oxide has a dielectric constant k of at least 3.85, typically 4.1-4.3, or higher. Air has a dielectric constant k of approximately 1.0. By definition, a vacuum has a dielectric constant k of 1.0.

A variety of low-k dielectric materials are known, and are typically defined as materials having a dielectric constant k less than 3.85—in other words, less than that of oxide. Sometimes, materials having k<2.5 are referred to as "ultralow-k". These low-k and ultralow-k dielectric materials can generally be characterized by their composition and/or by the way in which they typically are deposited.

Deposition is a process whereby a film of either electrically insulating (dielectric) or electrically conductive material is deposited on the surface of a semiconductor wafer. Chemical Vapor Deposition (CVD) is used to deposit both dielectric and conductive films via a chemical reaction that occurs between various gases in a reaction chamber. Plasma enhanced Chemical Vapor Deposition (PECVD) uses an inductively coupled plasma to generate different ionic and atomic species during the deposition process. PECVD typically results in a low temperature deposition compared to the corresponding thermal CVD process. Spin-on deposition is used to deposit materials such as photoresist, and can also be used to deposit dielectric materials. A wafer is coated with material in liquid form, then spun at speeds up to 6000 rpm, during which the liquid is uniformly distributed on the surface by centrifugal forces, followed by a low temperature bake which solidifies the material.

Examples of Spin-on Low-k Materials Include:
BCB (divinylsiloxane bisbenzocyclobutene), sold by Dow Chemical.
SILK™, an organic polymer with k=2.65, similar to BCB, sold by Dow Chemical.
NANOGLASS™, an inorganic porous polymer with k=2.2, sold by Honeywell.
FLARE 2.0™ dielectric, an organic low-k poly(arylene) ether available from Allied Signal, Advanced Microelectronic Materials, Sunnyvale, Calif.
Inorganic materials such as spin-on glass (SOG), fluorinated silicon glass (FSG) and, particularly, methyl-doped porous silica which is referred to by practitioners of the art as black diamond, or BD.
Organo-silicate materials, such as JSR LKD 5109 (a spin-on material, Japan Synthetic Rubber)
Organic polymers (fluorinated or non-fluorinated), inorganic polymers (nonporous), inorganic-organic hybrids, or porous materials (xerogels or aerogels).
Materials in the parylene family of polymers, the polynapthalene family of polymers, or polytetrafluoroethylene.

Examples of Low-k Chemical Vapor Deposition (CVD) and Plasma Enhanced CVD (PECVD) low-k materials include:
Black Diamond™, a organosilicon glass (OSG) which is a Si—O—C—H type of material, with a dielectric constant k of 2.7 to 3.0 (e.g., 2.9), sold by Applied Materials Inc.
CORAL™, also an organosilicon glass (OSG) which is a Si—O—C—H type of material, with k of 2.7-3.0, sold by Novellus Systems, Inc.
fluorinated $SiO_2$ glass (FSG), and
diamond like carbon or fluorine-doped diamond like carbon (amorphous C:F).

It is also known that pores in dielectric materials can lower the dielectric constant. Low-k dielectric materials can typically be deposited ab initio either with or without pores, depending on process conditions. Since air has a near 1 dielectric constant, porous films exhibit reduced dielectric constants than the base material in which they are developed. Generally, it is the spin-on materials (e.g., SiLK, NANOGLASS) materials that exhibit a high degree of porosity. The PECVD materials generally do not exhibit such high degree of porosity, due to the method of deposition. As a result it is very difficult to prepare a CVD film with a k value <2.5. For low-k dielectric materials having pores, it is important that an additional layer or film overlies the porous dielectric layer to act as a moisture barrier for the porous dielectric layer.

Capping Layer

Due to the need for low temperature processing after copper deposition, capping layers (also referred to as "cap layers") are typically deposited at temperatures below 450° C. Accordingly, capping layer deposition is typically performed using plasma-enhanced chemical vapor deposition (PE CVD) or high density plasma chemical vapor deposition (HDP CVD) wherein the deposition temperature generally ranges from about 200° C. to about 500° C.

PE CVD films have been used for many other applications in semiconductor device manufacturing. However, in using a cap layer such as silicon nitride for copper interconnects, conventional PE CVD silicon nitride films can create reliability problems. HDP silicon nitride has been shown to provide improved reliability vs. PE CVD silicon nitride (or "PE nitride").

HDP CVD films such as silicon nitride provide superior electromigration protection, as compared to PE CVD films, because HDP CVD films more readily stop the movement of copper atoms along the interconnect surface in the cap layer. However, in a conventional HDP deposition process, a seam is formed in the HDP CVD capping layer over topography, and a crack in the capping layer often develops at this seam due to stress within the structure. If the crack develops in a portion of the capping layer overlying a copper conductor, the copper conductor may be readily exposed to moisture and other sources of oxygen. If the crack develops in a portion of the capping layer overlying the ILD, the copper conductor may be exposed to moisture diffusing through the ILD. In the latter case, the seam is of relatively minor concern in interconnect structures utilizing silicon dioxide as the ILD material, because the rate of moisture diffusion through silicon dioxide is very low. However, in interconnect structures utilizing low-k polymeric thermoset dielectric materials such as SiLK tm, this seam is of greater concern, because the rate of moisture diffusion through most spin-on and CVD low-k materials is relatively high.

Moreover, any crack in the capping layer may lead to copper diffusion into the ILD through the seam. As a result of this copper diffusion, a copper nodule may form under the capping layer through the seams. This copper nodule may lead to leakage between adjacent interconnect lines.

HDP nitride is a common material for use as the capping layer over ILD as it exhibits excellent control over electromigration of underlying copper (Cu). However, HDP nitride has been found to exhibit seams which allow ingress of reactants (e.g., oxygen) into the underlying copper (Cu).

Because of the problem of seams in the HDP nitride, placement of an additional layer of material over the HDP nitride, to seal the seams, such as UV nitride (ultra-violet nitride; "UVN") or other plasma nitride has been suggested. (UVN is similar to and is sometimes referred to as PE CVD, or simply PE nitride.) However, PE nitride is not selective to oxide and will be compromised during via RIE. Another approach is to change the selectivity of the RIE, but this may increase the probability of underetched vias. Another approach is the use of alternate cap nitride film, but this loses the electromigration benefit of HDP nitride atop Cu.

UV nitride (UVN) is a particular form of PE CVD (PE) nitride deposited under certain select conditions; however, all PE nitrides can be distinguished from high density plasma (HDP) nitrides by virtue of process pressure and hardware used in the delivery of the HD plasma. PE nitrides are typically deposited in the range of a nominal 1 Torr pressure regime vs. a pressure of a few milliTorr used in HDP CVD. As a general proposition, with respect to a broad process window for RIE, PE nitrides are easier to etch than HDP nitride.

SUMMARY OF THE INVENTION

It is a general object of the invention to provide an improved HDP nitride-based capping layer for ILD, for better electromigration, better process window, and yield improvement. The invention solves the problem of Cu oxidation or etch out due to seams in the HDP nitride.

The present invention is generally directed to a cap nitride stack which prevents etch penetration to the HDP nitride while maintaining the electromigration benefits of HDP nitride atop Cu.

According to an embodiment of the invention, a capping layer for an interconnect structure comprising an interlevel dielectric (ILD) material and a copper conductor embedded in a surface of the ILD, the capping layer comprises: a first layer comprising HDP nitride disposed over a surface of the ILD and the copper conductor; and a second layer comprising a Si—C—H compound disposed over the first layer. The Si—C—H compound is for example BLoK, or N-BLoK (Si—C—H—N). Regarding the use of N-BLoK (or BLoK), this group of materials is one that has high selectivity during via RIE such that RIE chemistry from the next wiring level does not punch through. Carbon and nitrogen are the key elements. The selected material must also be able to be opened (compare 124) during the via open of subsequent trench RIE step. The ILD material comprises either silicon dioxide or a low-k dielectric material.

According to another embodiment of the invention, a capping layer for an interconnect structure comprising an interlevel dielectric (ILD) material and a copper conductor embedded in a surface of the ILD, the capping layer comprises: a first layer comprising HDP nitride disposed over a surface of the ILD and the copper conductor; a second layer selected comprising UVN disposed over the first layer; and a third layer comprising HDP nitride disposed over the second layer. Regarding the UVN layer, any other plasma (PE) nitride could be used. The ILD material comprises either silicon dioxide or a low-k dielectric material.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

In the drawings accompanying the description that follows, often both reference numerals and legends (labels, text descriptions) may be used to identify elements. If legends are provided, they are intended merely as an aid to the reader, and should not in any way be interpreted as limiting.

Often, similar elements may be referred to by similar numbers in various figures (FIGs) of the drawing, in which case typically the last two significant digits may be the same, the most significant digit being the number of the drawing figure (FIG).

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. However, well-known processing steps may not be described in detail in order to avoid unnecessarily obfuscating the description of the present invention.

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula $SiO_2$. For example, silicon nitride (stoichiometrically $Si_3N_4$, often abbreviated as "SiN") may be referred to simply as "nitride".

In the description that follows, exemplary dimensions may be presented for an illustrative embodiment of the invention. The dimensions should not be interpreted as limiting. They may be included to provide a sense of proportion. Generally speaking, it is the relationship between various elements, where they are located, their contrasting compositions, and sometimes their relative sizes that is of significance.

As discussed above, a HDP nitride capping (or cap) layer for Cu metallization has been found to have good electron migration properties. However, the HDP nitride has been observed to contain pinholes (small breaks) and seams (cracks around topography), which causes yield problems because during the via reactive ion etching (RIE) and resist strip, Cu (copper) can react with O (oxygen), F (fluorine), and I (iodine) which are able to reach the Cu through the seams in the HDP nitride.

Figure 2:
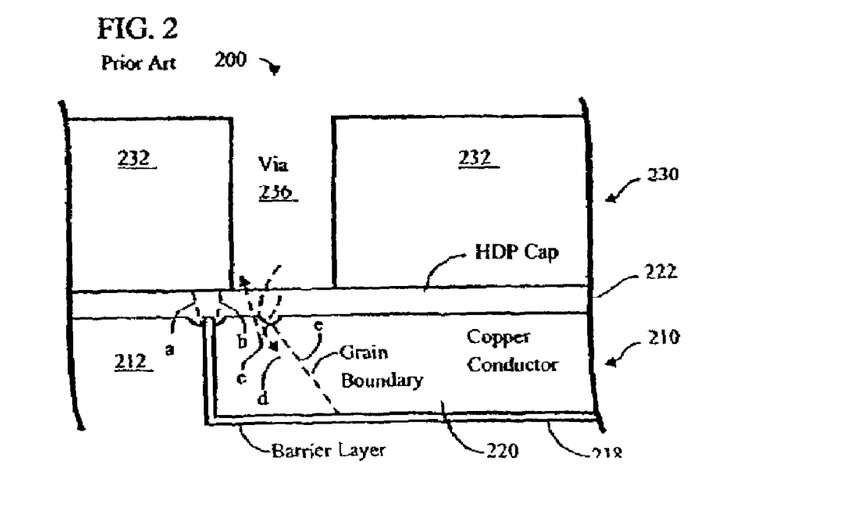
FIG. 2 is a cross sectional view of an interconnect structure illustrating seams in the HDP nitride capping layer, according to the prior art.

FIG. 2 depicts, in cross-section, two wiring levels 210 and 230 (compare 110 and 130) of an interconnect structure (compare 100), and generally illustrates the problems which can be caused by the aforementioned pinholes and seams.

A copper conductor 220 (compare 120) is shown embedded in a trench (see 114) in a first ILD layer 212 (compare 112). A barrier layer 218 (compare 118) under the copper conductor protects the copper conductor. A HDP nitride capping layer 222 (compare 122) is deposited over the first ILD layer. The HDP nitride capping layer 222 is on the surface of the ILD 212 as well as on the surface of the copper conductor 220. The surface of the copper conductor 220 is essentially coplanar with the surface of the ILD 212, typically as a result of chemical mechanical polishing (CMP).

A second ILD layer 232 (compare 132) is formed over the first ILD layer, and a via 236 (compare 136) is formed in the second ILD layer. The via 236 is typically formed using reactive ion etching (RIE). Here, this is called "via RIE". In this example, the ILD layers 212 and 232 are both silicon dioxide ($SiO_2$ oxide).

The interconnect structure 200 differs from the interconnect structure 100 in that the via 236 in the upper, second interconnect layer 230 extends completely through the interconnect layer 230, in single damascene fashion, rather than to a trench (134) in the upper, interconnect layer 130, in dual damascene fashion. Whether the interconnect level is single or dual damascene is not particularly relevant to the discussion of the present invention. The idea is to protect an underlying copper conductor in a wiring layer (interconnect level), however it happens to be there, thereby increasing reliability.

The HDP nitride capping layer 222, which is an insulator, of course eventually needs to be opened at the bottom of the via 236 so that metal (not shown; compare 140) filling the via 236 can physically and electrically contact the copper conductor 220 in the first interconnect level 210. An exemplary thickness for the HDP nitride capping layer 222 is approximately 45-55 nm.

As illustrated in FIG. 2, seams "a" and "b" in the HDP nitride capping layer 222 become an ingress path (see curved down arrow, d, extending from the via into the copper conductor) for Cu to react with moisture, which can leads to volume expansion of Cu metal and rupture of the capping layer 222. A result is that the via 236 can become contaminated with reacted material, which inhibits the HDP nitride from being opened at the bottom of the via 236. This can cause serious reliability issues. In the figure:

"a" and "b" represent ingress paths, seams at the step near the boundary of the copper conductor 220 and the ILD 212. These are shown in dashed lines.

"c" represents Cu that diffuses out due to volume expansion.

"d" represents oxygen or water that diffuses in through seam, ingress from via 236 into copper 220.

"e" represents the grain boundary. (Interface of different Cu metal grains.)

The little topological dip where the barrier layer 218 sticks up into the HDP nitride cap 222 is an artifact of the CMP (chemical mechanical polishing) process, as is the dip at the grain boundary "e".

Figure 3:
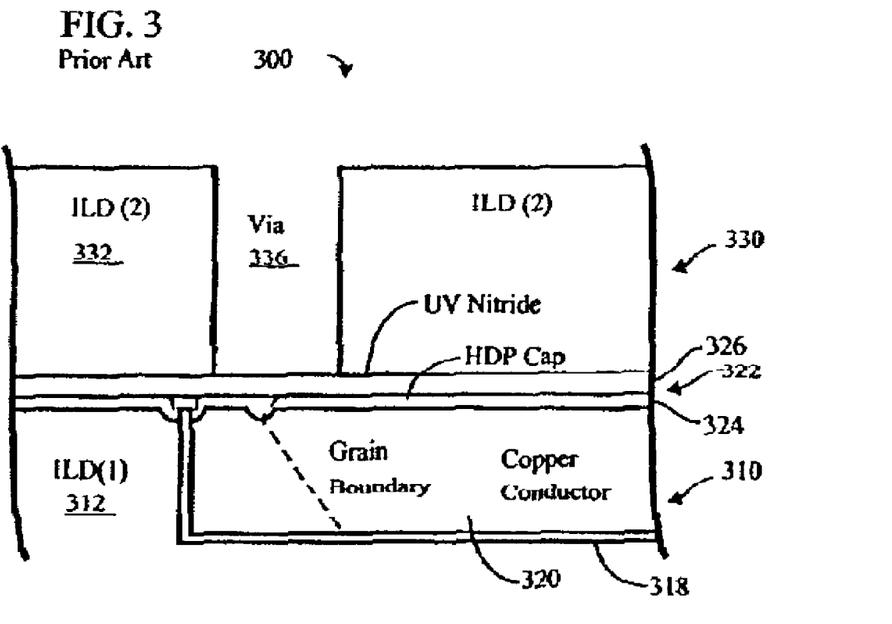
FIG. 3 is a cross-sectional view of an interconnect structure illustrating a solution to problems associated with having seams in the capping layer, by using UVN over the HDP nitride, according to the prior art.

FIG. 3 depicts, in cross-section, two wiring levels 310 and 330 (compare 210 and 230) of an interconnect structure 300 (compare 200), and illustrates a possible solution to the aforementioned problem of seams in the HDP nitride capping layer.

A copper conductor 320 (compare 220) is shown embedded in a trench (see 114) in first ILD layer 312 (compare 212). A barrier layer 318 (compare 218) under the copper conductor protects the copper conductor. The surface of the copper conductor 220 is essentially coplanar with the surface of the ILD 212, typically as a result of chemical mechanical polishing (CMP).

A capping layer 322 (compare 222) is deposited over the first ILD layer. The capping layer 322 is on the surface of the ILD 312 as well as on the surface of the copper conductor 320.

A second ILD layer 332 (compare 232) is formed over the first ILD layer 312, and a via 336 (compare 136) is formed in the second ILD layer. In this example, the ILD layers 312 and 332 are both silicon dioxide ($SiO_2$ oxide).

The interconnect structure 300 differs from the interconnect structure 200 in that the capping layer 322 (compare 222) for the first ILD layer 312 comprises two layers, a first HDP nitride layer 324 and a second ultraviolet (UV) nitride (UVN) layer 326.

An exemplary thickness for the HDP nitride 324 is approximately 5-70 nm (useful range), such as approximately 10-20 nm (preferred range), such as approximately 15 nm.

An exemplary thickness for the UV nitride (i.e., the PE nitride) 326 is approximately 10-50 nm (useful range), such as approximately 30-40 nm (preferred range), such as approximately 35 nm.

This UVN/HDP nitride cap 322 is introduced to cover the seam (e.g., "a", "b"), with the intent of fixing the aforementioned problems. However, there is a problem in that the UVN (top film) covers the seam, but the RIE selectivity between UV Nitride and $SiO_2$ is not as good as the RIE selectivity between HDP nitride and $SiO_2$. Because of this problem, via RIE punches through the UVN 326 and causes the similar chemical reaction as with the pure HDP nitride cap (222). Although the ILDs (312, 332) are described as being oxide, similar problems would arise using low-k dielectrics.

Figure 4:
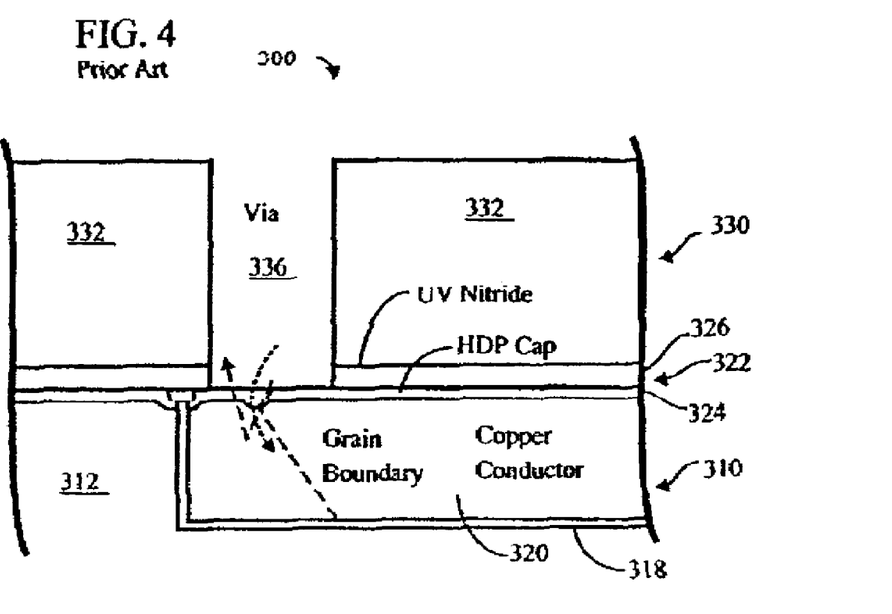
FIG. 4 is a cross sectional view of the interconnect structure of FIG. 3 illustrating a problem with the HDP/UVN capping layer, according to the prior art.

FIG. 4 illustrates a problem with the bilayer UVN/HDP cap of FIG. 3, which is that via RIE punches through the UVN 326 and lands on the HDP film 324. In this region of the via 336, sometimes the UVN can also be gone. In this figure, the UVN 326 is illustrated as being completely gone under the via 336, in which case the via RIE will land on the HDP nitride 324, resulting in the aforementioned problems. As in FIG. 2, a seam in the HDP nitride 324 can become an ingress path for Cu to react with moisture, which leads to volume expansion and cap rupture. Also, there is a possible reaction during via RIE through the seam. Generally speaking, the "fix" of FIG. 3 is inadequate, as illustrated by FIG. 4. Although the UVN over HDP stack offers a broad process window and the resulting structure has reduced the probability of problems versus HDP alone (FIG. 2), it is not 100% robust (due to RIE selectivity variations).

The Invention

Generally speaking, the aforementioned problem of poor selectivity between UVN and $SiO_2$ can be solved by using N-BLoK (or BLoK) instead of UVN in the capping layer, over the HDP nitride layer. (BLoK is a Si—C—H compound made by Applied Material Tool. N-BLoK is the Si—C—H—N compound made by Applied Material Tool.) Since NBLoK is mostly Si—C—H—N, the selectivity between $SiO_2$ and N-BLoK (or BLoK) is large and the via RIEprocess would stop on the N-BLoK (or BLoK) without risking damage to the HDP capping layer. Generically, BLoK and N-BLoK are referred to as silicon carbide and silicon carbonitrides (or nitrogen doped silicon carbide), respectively.

Generally speaking, it is important to have HDP nitride as the first layer over the embedded copper conductor for a good interface between Cu and the nitride capping layer. Therefore HDP nitride is the preferred film to be used for the first layer of a multi-layer capping layer. Subsequent layer(s) can be N-BLoK over the HDP first layer, or HDP over UVN over the HDP first layer, or HDP over N-BLoK over the HDP layer, to solve the selectivity issue during the via oxide RIE.

Figure 5:
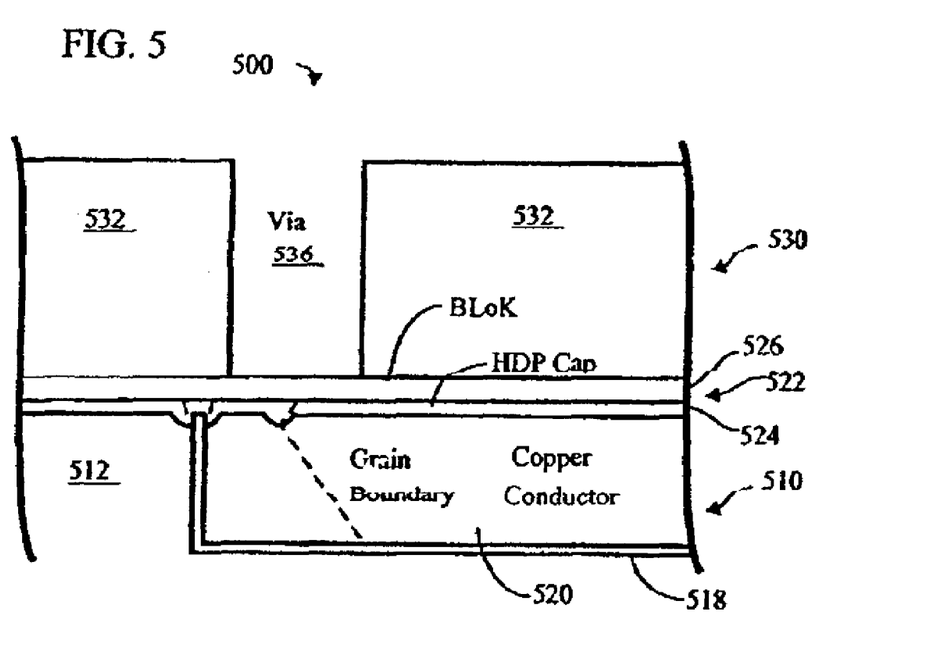
FIG. 5 is a cross-sectional view of an interconnect structure illustrating an embodiment of the invention using NBLoK (or BLoK) over the HDP nitride.

FIG. 5 illustrates an embodiment of the invention. The construction of the wiring levels 510 and 530 (compare 310 and 330) of an interconnect structure 500 (compare 300) are generally the same as in FIG. 3.

A copper conductor 520 (compare 320) is shown embedded in a trench (see 114) in first ILD layer 512 (compare 312). A barrier layer 518 (compare 318) under the copper conductor protects the copper conductor. The surface of the copper conductor 520 is essentially coplanar with the surface of the ILD 512, typically as a result of chemical mechanical polishing (CMP).

A capping layer 522 (compare 322) is deposited over the first ILD layer 512. The capping layer 522 is on the surface of the ILD 512 as well as on the surface of the copper conductor 520.

A second ILD layer 532 (compare 332) is formed over the first ILD layer 512, and a via 536 (compare 336) is formed in the second ILD layer 532. In this example, the ILD layers 512 and 532 may both be silicon dioxide (SiO$_2$; oxide). However, low-k material will work too. Any of the low-k materials listed above is good material.

The interconnect structure 500 is similar to the interconnect structure 300 in that the capping layer 522 (compare 322) for the first ILD layer 512 comprises two layers, and both have a first capping layer 534 (compare 334) which comprises HDP nitride.

The interconnect structure 500 is different from the interconnect structure 300 in that the second capping layer 526 (compare 326) of the overall capping layer 522 comprises N-BLoK (or BLoK), rather than UVN.

An exemplary thickness for the HDP nitride 524 is approximately 5-70 nm, such as approximately 10-20 nm, such as approximately 15 nm. (Generally, the same as it was for 324.)

An exemplary thickness for the N-BLoK (or BLoK) 526 is approximately 10-50 nm, such as approximately 30-40 nm, such as approximately 35 nm. (Generally the same as it was for 326.)

The dual layer stack (or composite capping layer) of N-BLoK (526) over HDP nitride (524) provides for better electron migration, better process window, and yield improvement.

The use of N-BLoK rather than UVN is based on not only the seam coverage, which can be done either by UVN or N-BLoK, but is also based on good selectivity between oxide RIE and cap material. In this case, UVN is not a good RIE stop material for oxide RIE, but N-BLoK is a good RIE stop material for oxide RIE due the high selectivity between oxide and N-BLoK. However, the best material for RIE selectivity is HDP. This is where a tri-layer stack, described immediately hereinbelow, can be useful.

Regarding the use of N-BLoK (or BLoK), this group of materials is one that has high selectivity during via RIE such that RIE chemistry does not punch through. Carbon and nitrogen are the key elements. The selected material must also be able to be opened (compare 124) during the via open of subsequent trench RIE step.

Figure 6:
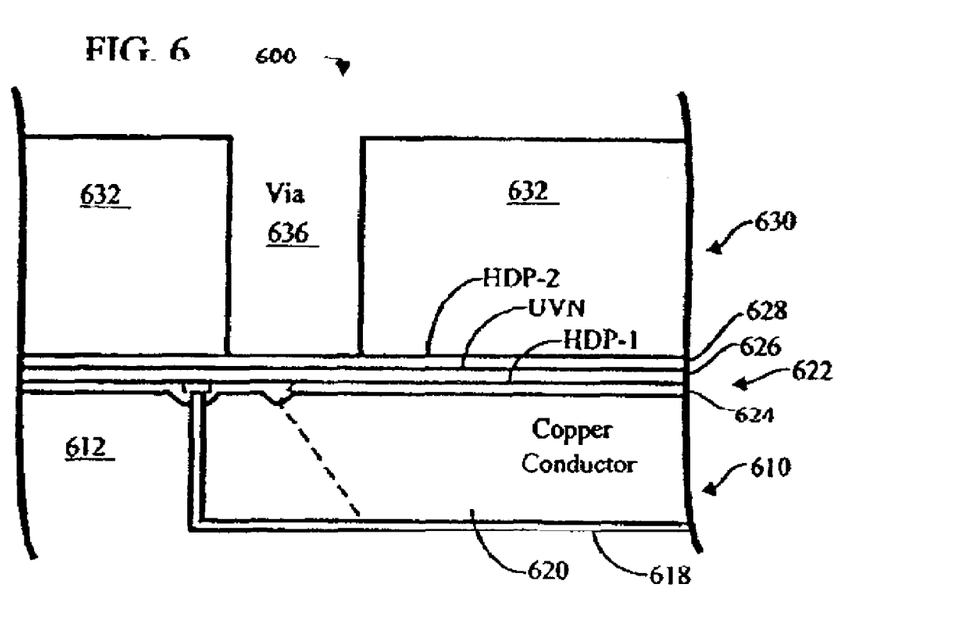
FIG. 6 is a cross-sectional view of an interconnect structure illustrating an embodiment of the invention using an additional HDP layer over the UVN layer which is over the HDP layer of FIG. 4.

FIG. 6 illustrates another embodiment of the invention. An interconnect structure 600 (compare 500) has two wiring levels 610 and 630 (compare 510 and 530).

A copper conductor 620 (compare 520) is shown embedded in a trench (see 114) in first ILD layer 612 (compare 512). A barrier layer 618 (compare 518) under the copper conductor 620 protects the copper conductor 620. The surface of the copper conductor 620 is essentially coplanar with the surface of the ILD 612, typically as a result of chemical mechanical polishing (CMP).

A capping layer 622 (compare 522) is deposited over the first ILD layer 612. The capping layer 622 is on the surface of the ILD 612 as well as on the surface of the copper conductor 620.

A second ILD layer 632 (compare 532) is formed over the first ILD layer 612, and a via 636 (compare 536) is formed in the second ILD layer 632. In this example, the ILD layers 612 and 632 may both be silicon dioxide (SiO$_2$; oxide). However, low-k material will work too. Any of the low-k materials listed above is good material.

The interconnect structure 600 is similar to the interconnect structure 500 in that the capping layer 622 (compare 522) for the first ILD layer 612 comprises multiple layers, and both have a first capping layer 634 (compare 534) which comprises HDP nitride.

The interconnect structure 600 is different from the interconnect structure 500 in that the multi-layer capping layer 622 comprises three layers, rather than two layers. More particularly, a layer 626 of UVN 626 is deposited over an initial layer 624 of HDP nitride (HDP-1). Then, a second layer 628 of HDP nitride (HDP-2) is deposited over the layer 626 of UVN. The first layer 624 of HDP nitride (HDP-1) is on the surface of the ILD 612 and the copper conductor 620.

Regarding the UVN layer 626, it is within the scope of the invention that any other plasma nitride could be used. One must distinguish PE nitride, of which, UV nitride is a particular flavor, from high density plasma (HDP) nitride which is a nitride of different chemical composition and stress and different interaction with layer below. Thus, one sees reliability improvement and different RIE selectivity.

The goal of the stack is to have the first layer of HDP 624 thick enough to provide the electromigration protection, the UVN 626 thick enough to cover the seams in the HDP 624, and the top layer 628 thick enough to provide etch stop protection. The thickness of all three layers will depend on the user's technology. Exemplary thicknesses for the three layers are set forth immediately below.

An exemplary thickness for the first HDP layer 624, HDP-1, is approximately 5-20 nm, such as approximately 10 nm.

An exemplary thickness for the UVN layer 626 is approximately 10-20 nm, such as approximately 15 nm.

An exemplary thickness for the third layer 628, that is the second HDP layer HDP-2, is approximately 10-35 nm, such as 10 nm.

In a preferred embodiment, the first HDP layer 624 has a thickness of approximately 15 nm, the UVN layer 626 has a thickness of approximately 20 nm, and the third layer 628 has a thickness of approximately 15 nm. The total thickness of the three layers forming the stack is approximately 50 nm. A minimum preferred total thickness for the stack is at least 50 nm, or 500 A.

In this embodiment, rather than having a dual layer capping layer stack of N-BLoK over HDP (as in FIG. 5), we have a tri-layer stack of HDP nitride over UVN over HDP nitride. This can be more practical because both UVN and HDP nitride can be deposited in the same tooling system without taking the wafer out of the vacuum. The dual layer stack of N-BLoK over HDP suffers from a problem that HDP nitride is in one tool set and N-BLoK is in another tool set. The wafer would have to be taken out of vacuum to perform these two depositions. So, although a tri-layer stack of HDP over N-BLoK over HDP would be desirable from a performance perspective, it may not be preferred from a tooling perspective. (It is however contemplated that one could build a tool to do the tri-layer stack without breaking vacuum.) Ultimately, the choice between doing the two-layer stack of FIG. 5 or the three layer stack of FIG. 6 may simply depend upon the via RIP process available.

In a variation on this embodiment of the invention, the second layer (626) can be a Si—C—H material, such as BLoK or N-BLoK. In other words, a tri-layer capping layer of HDP nitride over Si—C—H over HDP nitride. However, it is doubtful that such a stack would have any useful benefits. For one thing, it would be limited by the process tooling involved. Secondly, no advantage can be seen to depositing HDP nitride over N-BLoK. As a general proposition, the improvement over HDP/UVN (FIG. 2) is either HDP/N-BLoK (FIG. 5) or HDP/UVN/HDP (FIG. 6). Both N-BLoK and HDP are better etch stops for oxide RIE than UVN. But for the sake of completeness, a figure illustrating such an embodiment (HDP/N-BLoK/HDP) would look exactly like FIG. 6, with N-BLoK being substituted for UVN. The dimensions for the various layers of the multi-layer capping layer would be in the same ranges as discussed above for the embodiment of FIG. 6.

A suitable material for the HDP nitride layer (524, 624) layer is HDP CVD silicon nitride having a composition of about 30-50 atomic percent silicon, about 40-65 atomic percent nitrogen and about 5-13 atomic percent hydrogen, such as about 40 atomic percent silicon, about 52 atomic percent nitrogen, and about 8 atomic percent hydrogen. It is within the scope of the invention that the HDP nitride layer can be replaced with an HDP layer of silicon carbide or silicon carbonitride or silicon boronitnide, also HDP boron nitride. As a general proposition, it is preferred to have some nitrogen, but that is not absolutely necessary (such as in the case of silicon carbide).

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given on particular application.

What is claimed is:

1. Capping layer for an interconnect structure comprising an interlevel dielectric (ILO) material and a copper conductor embedded in a surface of the ILD, the capping layer comprising:
   a first layer comprising a material selected from the group consisting of HDP nitride, silicon carbide, silicon carbonitride, silicon boronitride and HDP boron nitride disposed over a surface of the ILD and the copper conductor; and
   a second layer, disposed over the first layer, comprising a material that has high selectivity during via RIE such that RIE chemistry does not punch through the second layer, and that is also able to be opened during via open of a subsequent trench RIE step;
   wherein the second layer comprises a material selected from the group consisting of Si—O—C—H, Si—C—H and Si—C—H—N.

2. The capping layer of claim 1, wherein:
   the first layer comprises HDP CVD silicon nitride having a composition of about 30-50 atomic percent silicon, about 40-65 atomic percent nitrogen and about 5-13 atomic percent hydrogen.

3. The capping layer of claim 2, wherein:
   the first layer further comprises HDP CVD silicon nitride having a composition of about 40 atomic percent silicon, about 52 atomic percent nitrogen, and about 8 atomic percent hydrogen.

4. The capping layer of claim 1, wherein:
   the first layer has a thickness of approximately 5-70 nm.

5. The capping layer of claim 1, wherein;
   the first layer has a thickness of approximately 10-20 nm.

6. The capping layer of claim 1, wherein:
   the second layer has a thickness of approximately 10-50 nm.

7. The capping layer of claim 1, wherein:
   the second layer has a thickness of approximately 30-40 nm.

8. The capping layer of claim 1, wherein:
   the ILD material comprises silicon dioxide.

9. The capping layer of claim 1, wherein:
   the ILD material comprises a low-k dielectric material.

10. Capping layer for an interconnect structure comprising an interlevel dielectric (ILD) material and a copper conductor embedded in a surface of the ILD, the capping layer comprising:
    a first layer comprising HDP CVD silicon nitride having a composition of about 30-50 atomic percent silicon, about 40-65 atomic percent nitrogen and about 5-13 atomic percent hydrogen disposed over a surface of the ILD and the copper conductor;
    a second layer comprising a FE nitride disposed over the first layer; and
    a third layer comprising a material selected from the group consisting of HDP nitride, silicon carbide, silicon carbonitride, silicon boronitride and HDP boron nitride disposed over the second layer.

11. The capping layer of claim 10, wherein:
    the first layer comprises HDP CVD silicon nitride having a composition of about 40 atomic percent silicon, about 52 atomic percent nitrogen, and about 8 atomic percent hydrogen.

12. The capping layer of claim 10, wherein:
    the first layer is thick enough to provide for electromigration protection;
    the second layer is thick enough to cover seams in the first layer; and
    the third layer is thick enough to provide etch stop protection.

13. The capping layer of claim 10, wherein:
    the second layer comprises UV nitride.

14. Capping layer for an interconnect structure comprising:
    a tri-layer stack of HDP nitride over UVN over HDP nitride.

15. Capping layer for an interconnect structure comprising an interlevel dielectric (ILD) material and a copper conductor embedded in a surface of the ILD, the capping layer comprising:
    a first layer comprising a material selected from the group consisting of HDP nitride, silicon carbide, silicon carbonitride, silicon boronitride and HDP boron nitride disposed over a surface of the ILD and the copper conductor;
    a second layer, disposed over the first layer, comprising N-BLoK; and
    a third layer, disposed over the second layer, comprising a material selected from the group consisting of HDP nitride, silicon carbide, silicon carbonitride, silicon boronitnide and HDP boron nitride.

* * * * *